United States Patent
Ropers et al.

(10) Patent No.: US 11,151,294 B1
(45) Date of Patent: Oct. 19, 2021

(54) EMULATED REGISTER ACCESS IN HYBRID EMULATION

(71) Applicant: Synopsys, Inc., Mountain View, CA (US)

(72) Inventors: Andreas Gerd Ropers, Aachen (DE); Sylvain Bayon de Noyer, Tokyo (JP); Alexandru Fiodorov, Aachen (DE); Filip Constant Thoen, San Jose, CA (US); Markus Wedler, Aachen (DE)

(73) Assignee: Synopsys, Inc., Mountain View, CA (US)

(*) Notice: Subject to any disclaimer, the term of this patent is extended or adjusted under 35 U.S.C. 154(b) by 738 days.

(21) Appl. No.: 15/920,163

(22) Filed: Mar. 13, 2018

Related U.S. Application Data

(60) Provisional application No. 62/473,275, filed on Mar. 17, 2017.

(51) Int. Cl.
*G06F 30/33* (2020.01)
*G06F 11/36* (2006.01)

(52) U.S. Cl.
CPC ............ *G06F 30/33* (2020.01); *G06F 11/362* (2013.01)

(58) Field of Classification Search
CPC ................................ G06F 30/33; G06F 11/362
See application file for complete search history.

(56) References Cited

U.S. PATENT DOCUMENTS

| | | |
|---|---|---|
| 7,346,482 B1 | 3/2008 | Ballagh et al. |
| 7,366,652 B2 | 4/2008 | Wang et al. |
| 7,395,197 B2 | 7/2008 | Nakamura |
| 7,424,416 B1 | 9/2008 | Cavanagh et al. |
| 8,145,466 B1 * | 3/2012 | Chan ................ G06F 30/33 703/14 |
| 8,793,628 B1 | 7/2014 | Varma |
| 2003/0074177 A1 * | 4/2003 | Bowen ............... G06F 30/33 703/22 |
| 2006/0015313 A1 * | 1/2006 | Wang ................. G06F 30/331 703/14 |
| 2013/0124183 A1 * | 5/2013 | Braun ................ G06F 30/33 703/14 |

* cited by examiner

*Primary Examiner* — Bijan Mapar
(74) *Attorney, Agent, or Firm* — Fenwick & West LLP

(57) ABSTRACT

One or more embodiments disclosed herein pertain to a hybrid emulation system for hybrid emulation of a design under test (DUT). The system comprises a hardware emulation system to emulate a first portion of the DUT during the hybrid emulation. The hardware emulation system includes emulated registers for the first portion of the DUT. The hybrid emulation system also comprises a simulation system to simulate a second portion of the DUT during the hybrid emulation. The hybrid emulation system additionally comprises a configuration file that identifies a subset of the emulated registers. The simulation system is configured with the configuration file to selectively mirror, during the hybrid emulation, the subset of the emulated registers identified by the configuration file.

23 Claims, 3 Drawing Sheets

EMULATED REGISTER ACCESS IN HYBRID EMULATION

CROSS REFERENCE TO RELATED APPLICATIONS

This application claim a benefit of U.S. Patent Application No. 62/473,275, filed Mar. 17, 2017, the content of which is incorporated by reference in its entirety.

TECHNICAL FIELD

The present application generally relates to hybrid emulation of a design under test (DUT).

BACKGROUND

A hybrid emulation system simulates, e.g., on a host processor, a portion of a DUT and emulates, e.g., on an emulator, another portion of a DUT. For example, DUT of a processor core may be simulated while subsystems such as a graphical processing unit and memory controller of that DUT may be emulated on an emulator.

A problem with hybrid emulation systems is the management of hardware registers of hardware components and/or subsystems when using embedded software debuggers, which will display the value of these registers to the developer to aid the software debugging. Such debuggers may access simulation registers but cannot access emulation registers. To access emulation registers, conventional hybrid emulation systems use a brute force approach and shadow all the registers in the emulation system on the simulation system. This is highly inefficient as it is time consuming and requires significant computing resources on the simulation system to set up and manage.

DETAILED DESCRIPTION

Figure 1:
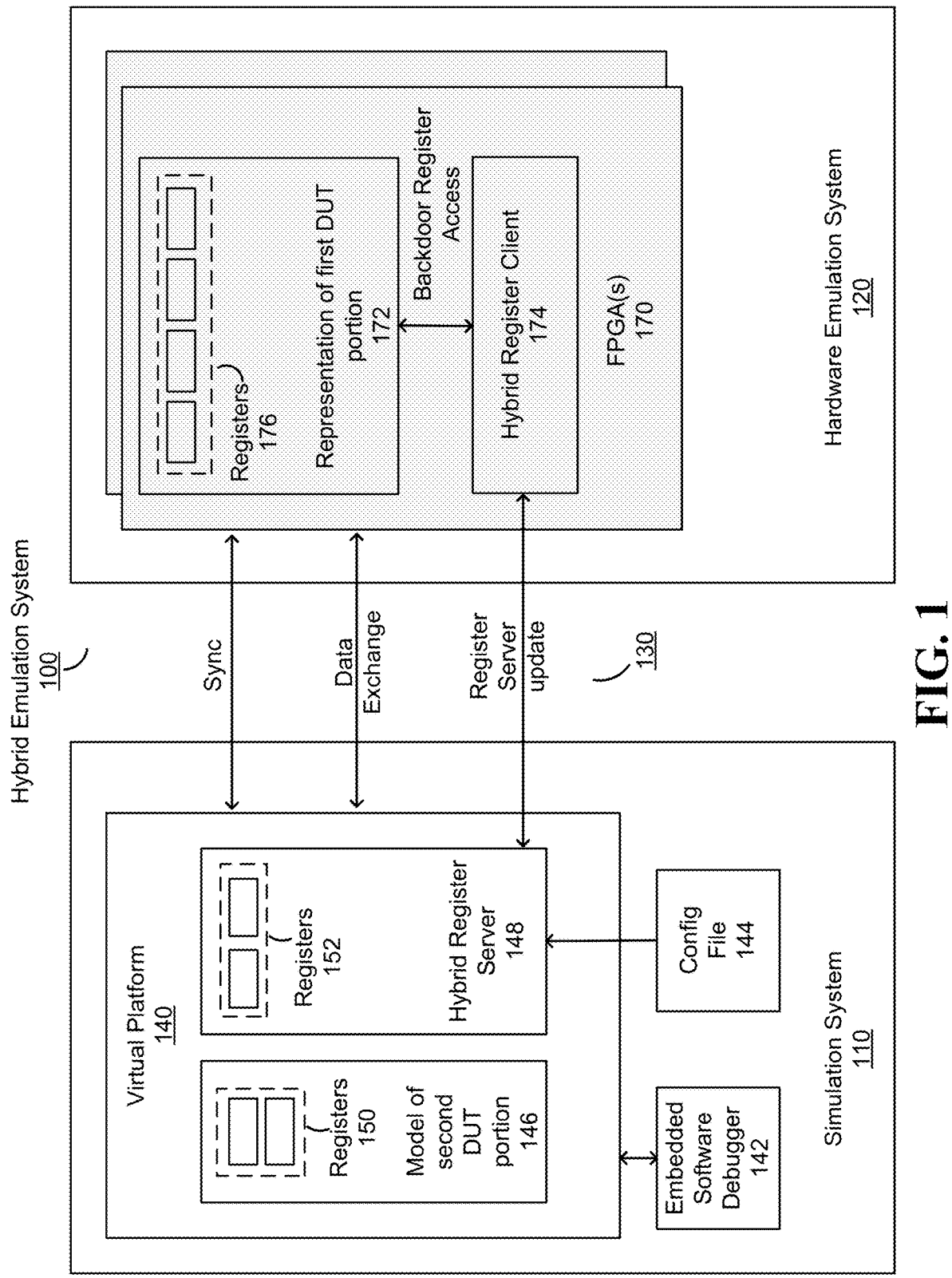
FIG. 1 is a block diagram of a hybrid emulation system configured to perform a hybrid emulation of a design under test (DUT), according to one or more embodiments of the present disclosure.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

One or more embodiments disclosed herein pertains to a hybrid emulation system for hybrid emulation of a design under test (DUT). The system comprises a hardware emulation system to emulate one (e.g., a first) portion of the DUT during the hybrid emulation. The hardware emulation system includes emulated registers for the first portion of the DUT. The hybrid emulation system also comprises a simulation system to simulate another (e.g., a second) portion of the DUT during the hybrid emulation. The hybrid emulation system also comprises a configuration file that identifies a subset of the emulated registers. The simulation system is configured with the configuration file to selectively mirror, during the hybrid emulation, the subset of the emulated registers identified by the configuration file.

An embedded software debugger may be included in the simulation system. The hardware emulation system supports a first access mechanism for the plurality of emulated registers that causes a side effect to occur when the emulated registers are accessed. The hardware emulation system supports a second access mechanism for the emulated registers that does not cause the side effect to occur when the emulated registers are accessed. The hardware emulation system may be configured to use the first and/or second access mechanism in response to an access request from the embedded software debugger. For example, the side effect can be a clear on read.

A hybrid register server in the simulation system that supports register definition and configurable behaviors for handling requests received from the embedded software debugger for accessing the subset of the emulated registers. The configurable behaviors may be configured based on information in the configuration file.

In some example embodiments, the first portion of the DUT may be, for example, a graphical processing system or memory controller. Further by example, the second portion of the DUT may correspond to a processor. An instruction accurate model of the processor can be used to simulate the second portion of the DUT.

In some example embodiments, the simulation system comprises a virtual platform including a hybrid register server. The hybrid register server is configured with the configuration file to define the individual registers, including address offset set, bitfields and description, and selectively mirrors, during the hybrid emulation, the subset of the plurality of the registers identified by the configuration file.

Example Hybrid Emulation System

FIG. 1 is a block diagram of a hybrid emulation system 100 configured to perform a hybrid emulation of a design under test (DUT), according to one or more embodiments of the present disclosure. A DUT may represent an integrated circuit such as a system on chip (SoC), or a computing device with multiple chips.

As shown, hybrid emulation system 100 includes a simulation system 110 and a hardware emulation system 120. The hardware emulation system 120 is configured to emulate a first portion of the DUT and the simulation system 110 is configured to emulate a second portion of the DUT during a hybrid emulation. The hardware emulation system may be any emulation system (e.g., custom processor based, custom emulator on-chip, FPGA). By way of example, and ease of discussion, the examples herein will be described in the context of field programmable gate arrays (FGPA) 170 emulators. The principles described herein may apply to other emulation systems.

An FPGA emulator may include two or more FPGAs 170. In this example description, the FPGAs 170 include a representation 172 of a first portion of the DUT and a hybrid register client 174. The simulation system 110 includes a virtual platform 140, an embedded software debugger 142 and a configuration file 144. The virtual platform 140 includes a model 146 for a second portion of a design under test (DUT). The virtual platform 140 also includes a hybrid register server (HRS) 148.

Hybrid emulation combines emulation and simulation (e.g., virtual prototyping) to enable earlier architecture validation and software development, as well as higher performance for software-driven hardware verification even when RTL source code for critical blocks is not available. For the hardware architect, it enables processor subsystems loaded into an emulator 120 to serve as a high-performance, cycle-accurate model for SoC performance and architecture validation through cycle accurate interfaces to SystemC models of other blocks like memory controllers and subsystems in the virtual platform 140. For the software developer, instruction accurate models in the virtual prototype are used for software development with the remaining SoC design blocks running at high speed in the hardware emulation system 120, reducing the modeling burden for complex blocks like GPUs. For the verification engineer, pre-verified processor subsystem blocks may be moved out of the hardware emulation system 120 and executed on the virtual platform 140 using a virtual prototype of the processor subsystem. This may free up emulator capacity while increasing overall performance, and allows an earlier emulation start as a partial subset of the RTL subsystem only needs to be available.

A hybrid emulation setup may include a virtual platform 140 and a hardware emulation system 120 that is coupled to the virtual platform 140. A protocol transactor (not shown) may handle communication between the virtual platform 140 and the hardware emulation system 120. The simulation system 110 and the hardware emulation system 120 can communicate with each other over one or more communication channels 130 during the hybrid emulation and for debugging the hybrid emulation. Hybrid emulation also may be referred to as co-simulation and co-emulation.

In hybrid emulation, a DUT is partitioned into different portions. A portion (e.g. graphics processing unit, USB controller, other IP blocks) of a DUT is emulated in a hardware emulation system 120 by loading a representation 172 of the first DUT portion into, for example, the FPGAs 170. The emulated portion of the DUT may be originally written in a register transfer language (RTL) that is compiled into an appropriate representation and then loaded into the field programmable gate arrays (FPGAs) 152 of the hardware emulation system 120, thereby resulting in a representation 171 of the first DUT portion. The first DUT portion can have registers, which are shown as emulated registers 176 within the representation 172 of the first DUT portion. It is noted that there may be a latch coupled with the emulated registers 176, although in other embodiments there may be no additional latch. It if further noted that where there is no additional latch, the registers 176 may be considered a latch. An example of a hardware emulation system 120 can be SYNOPSYS ZEBU.

Another portion (e.g. the processors, some peripherals) of the DUT may be represented by a C++ or SystemC software model 164 within a virtual platform 140 that is simulated in a simulation system 110. For example, the model 146 can be a virtual prototype of the processor that is simulated by the simulation system 110. The virtual prototype can be a SystemC virtual prototype. The virtual prototype can contain an instruction accurate processor model. The model 146 of the second DUT portion may include registers 150. The virtual prototype 140 can be executed on the simulation system 110, thereby resulting in a simulation of the second DUT portion. The simulation system 110 can be a host computing device with a physical processor and physical memory.

An embedded software debugger 142 is connected to the virtual prototype 140. The embedded software debugger 142 can communicate register access requests and simulation control information with the virtual prototype 140. A typical embedded software debugger 142 can access (read/write) and display registers 150 that reside on the virtual prototype 140 only. To allow access to the emulated registers 176 on the hardware emulation system 120, a hybrid register server (HRS) 148 is introduced. The hybrid register server 148 is a new technology that enables novel ways of performing embedded software development and debug using hybrid emulation setups.

Without the hybrid register server 148, the embedded software debugger 142 can only access registers 150 of the DUT that are located in the virtual prototype 140. However, to efficiently develop software, one may need to also access emulated registers 176 that reside in the hardware emulation system 120.

In complex debug scenarios, the embedded software debugger 142 will need to access registers with different access behavior. For example, registers 176 in the emulator might exhibit access side effects when they are accessed (e.g., clear on read). This is unwanted in most of the cases, but cannot be handled without the embodiments presented here.

The hybrid register server 148 helps solve these problems. The hybrid register server 148 will selectively mirror a subset of the emulated registers 176. The hybrid register server 148 contains a set of mirrored registers 152 that correspond to a particular subset of the emulated registers 176. The subset of registers are specified by information in the configuration file 144. The registers 152 and 176 may be kept in synchronization with each other (default behavior) and are accessible to the embedded software debugger 142. The hybrid register server 148 is coupled between the model 146 of the second DUT portion and the hardware emulation system 120. Each read/write request during the simulation to the subset of the emulation registers 176 will be forwarded to the hardware emulation system 120 by the hybrid register server 148. The result of a read operation will be stored in the virtual prototype copy 152 of the register managed by the hybrid register server 148. These communications may be represented by the "sync" text in FIG. 1.

If the embedded software debugger 142 accesses such a register during a debug mode, the hybrid register server 148 may handle those requests in accordance with specific behaviors for debug read/write accesses as specified in the configuration file 144. The hybrid register client (HRC) 174, which resides in the emulator 120, may handle those requests as specified in the configuration file and execute the requested behavior.

In some embodiments, the hybrid register server 148 can be a transaction level modeling (TLM2) model used in the virtual prototype 140 to provide access to the emulated registers 176. The hybrid register server 148 can serve as a proxy for the emulated registers 176. It can be configured to contain a set of mirrored registers 152 that correspond to a particular subset of the emulated registers 176. The values of the mirrored registers 152 and the emulated registers 176 are kept in sync.

The hybrid register server 148 has two main functionalities: register access and configurable forwarding behavior for registers 176 of peripherals that are modelled in the hardware part of a hybrid system simulation (e.g. in the hardware emulation system 120). The hybrid register server 148 enables the following functionality, which is not available/possible without the embodiments described herein.

First, through the configuration file 144, specific emulated registers 176 may be configured to be accessible to the embedded software debugger 142. Emulated registers 176 are typically described in the configuration file 144 by a hierarchical name that pinpoints the register within the DUT hierarchy. In some embodiments, the configuration file 144 can designate a subset of the emulated registers 176 by their offset and provide names for the identified registers. The configuration file 144 can also describe read access behaviors and write access behaviors for the registers.

As a typical hardware design contains several thousands of registers, the designer of the hybrid prototype can decide, which of them shall be visible to the embedded software debugger 142. This is done during configuration of the HRS residing in the virtual prototype 140, thus, allowing the designer to only make specific emulated registers 176 available to the software developer. This is a huge benefit for the designers as they now have access to the relevant emulated registers 176. Only a subset of the registers 176 need to be mirrored in the simulation system 110, which reduces overhead of mirroring every emulated register 176 in the simulation system 110. The designer can use different configuration files 144, depending on the development scenario. For example, a software engineer being responsible for developing a LINUX device driver will be interested in a different set of registers compared to an application developer for a smartphone.

Second, the configuration of read/write behaviors is possible through the configuration file 144. The configuration file 144 may specify, for each register 176 identified by the configuration file 144, a read/write behavior that will be used to access the register 176 through the hybrid register server 148. The hybrid register server 148 may be configured in accordance with this information.

The normal behavior to access an emulated register 176 through FIRS 148 is that a read or write request may be forwarded to the emulator 120 and the result is stored inside the registers 152 of the hybrid register server 148. However, this default behavior might not be applicable for certain emulated registers 176. For example, some emulated registers 176 may be faulty due to some design error or because the aspects of the DUT around the register 176 are not completely designed yet. However, the software designer may still want to test software using the hybrid emulation system despite these problems. The hybrid register server 148 offers different modes to handle those requirements. Those modes will affect accesses (read/write) resulting from the execution of the embedded software as well as debug accesses resulting from user interactions with an embedded software debugger.

The following are examples of behavior modes available for a read access:

Ignore: Does not read from the emulated register 176 in the emulator. Reads from the local copy of the register 152 inside the FIRS 148 instead.

Error: Issues a read from the emulator 120, but ignores the result and returns the value of the register 152 stored inside the FIRS 148 without updating it. This may use the backdoor access mechanism described below.

Default: Reads from the emulator 120 and updates the value of the register 152 inside the HRS. This may use the backdoor access mechanism described below.

The following behavior modes are available for a write access:

Ignore: Writes to the register 152 inside the hybrid register server 148 but does not write to the emulator Error: writes the value that is stored inside the hybrid register server 148 to the corresponding register in the emulator. This may use the backdoor access mechanism described below.

Default: Writes to the register inside the hybrid register server 148 and to the emulator. This may use the backdoor access mechanism described below.

Figure 2:
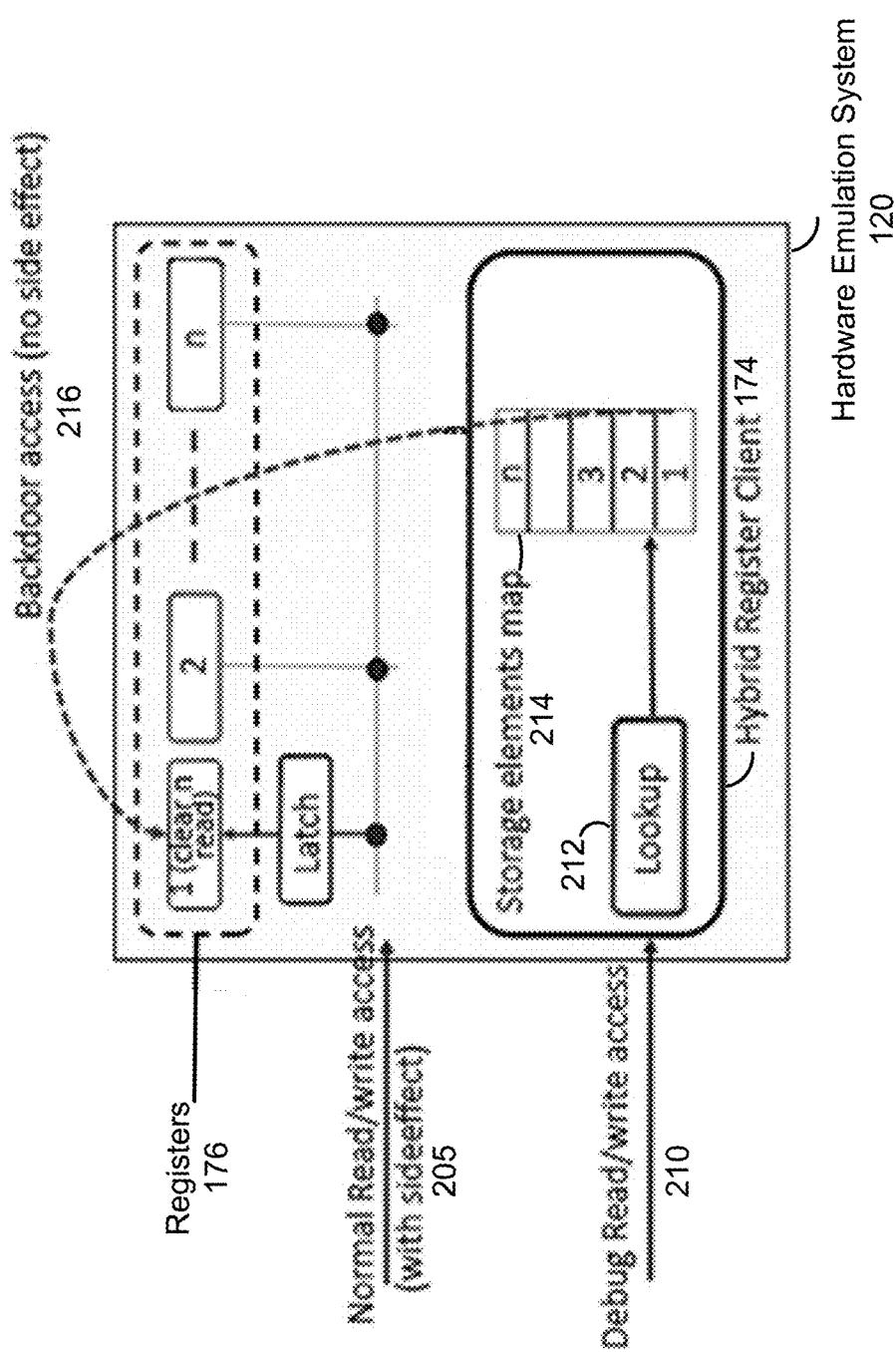
FIG. 2 is a block diagram of a hybrid register client and accessing emulated registers in a hardware emulation system, according to one or more embodiments of the present disclosure.

FIG. 2 is a block diagram of a hybrid register client 174 and accessing emulated registers in a hardware emulation system 120, according to one or more embodiments of the present disclosure. The hybrid register client (HRC) (e.g., an emulator run-time manager) 174 may be used to access hardware blocks in a portion of an FPGA 170. The HRC 174 may have a corresponding RTL description that is compiled and then loaded onto FPGAs 170 of the hardware emulation system 120.

Some registers 176 allow for access via the hybrid register client 174. This component may detect accesses 210 coming from the hybrid register server 148 and handle them in a specific way. The reason for this is that a normal read or write access 205 to an emulated register 176 can cause a side effect (for example, setting a register to zero when a read occurs). In a debug scenario this is an unwanted behavior. The hybrid register client 174 can detect such requests 210 from the hybrid register server 148 and access the registers 176 in a different way to prevent such side effects.

The hybrid register client 174 may receive debug read and write accesses 210 from the hybrid register server 148. All storage elements in the emulated portion of the design (e.g. registers 176 and memories) can be accessed with a unique identifier that pinpoints the element in the design hierarchy. The identifier is used to lookup 212 the specific register location from a storage elements map 214. As soon as the request 210 is received in the hybrid register client 174, the emulator 120 provides a 'backdoor' access 216 to the storage element. The read/write request 210 is then forwarded directly to the storage element 176, bypassing all other functionality that would be executed by a normal read/write request 205.

In the depicted example, a normal read/write request 205 received from the virtual prototype 140 would trigger a 'clear on read' behavior (or 'clear on write' behavior). This is because the normal read/write request 205 is handled using primary (e.g., a front door through a bus) register access mechanism that has the side effect. In contrast, a debug read 210 will be executed by the hybrid register client 174, which provides a backdoor access 216 to storage element 1 and will not trigger the side-effecting behavior. The backdoor access 216 is performed through backdoor register access mechanism that bypasses the primary register access mechanism and does not cause the side effect when accessing the registers 176.

The important difference is that all debug accesses 210 (either read or write) will be non-intrusive. This means that they will not alter the state of the DUT portion being emulated. This is important as software developers prefer that the act of debugging not to influence the outcome of the system. The kind of debug actions that are performed must not alter the simulation in any way.

Figure 3:
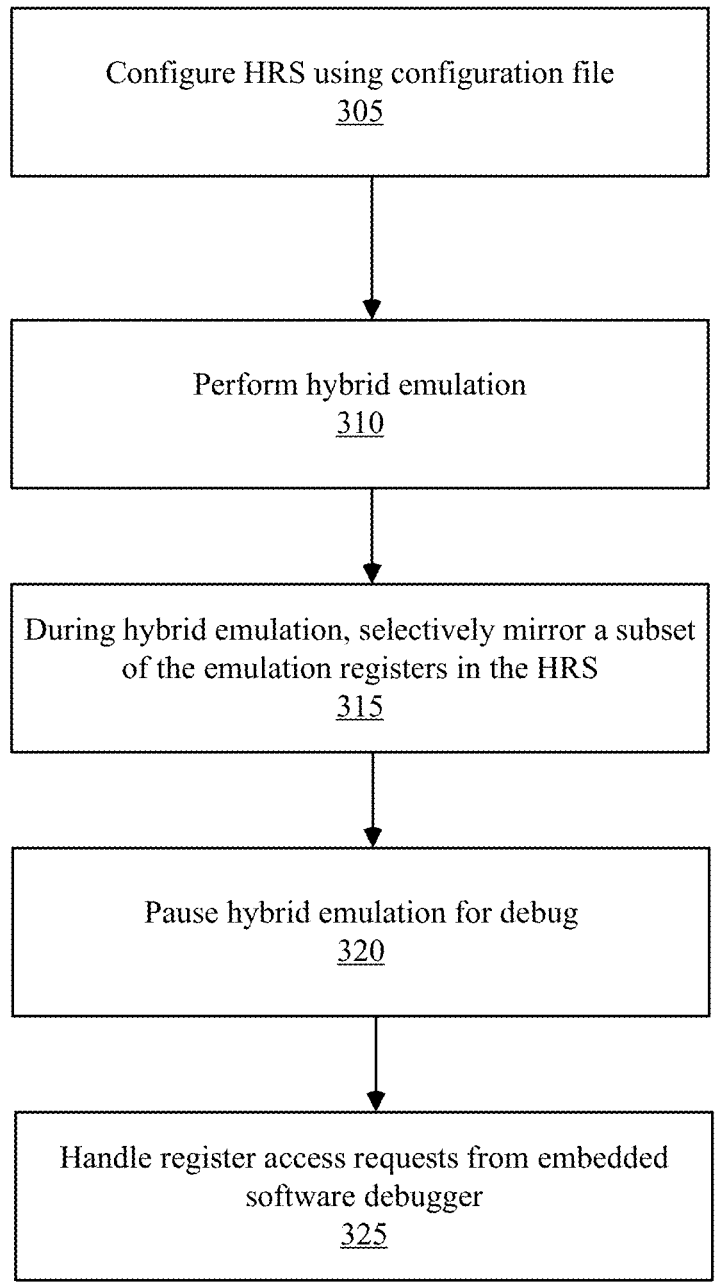
FIG. 3 is a flowchart for a method of operation in the hybrid emulation system, according to one or more embodiments of the present disclosure.

FIG. 3 is a flowchart for a method of operation in the hybrid emulation system, according to one or more embodiments of the present disclosure.

In step 305, the hybrid register server 148 of the simulation system 110 is configured in accordance with a configuration file 144. The configuration file identifies a subset of the emulated registers that are to be mirrored by the hybrid register server 148 and that can be accessed by the embedded software debugger 142. The hybrid register server 148 uses the configuration information in the configuration file to determine which of the emulated registers 176 it will mirror and which of the emulated registers 176 it will not mirror. The hybrid register server 148 can also use the configuration file 144 to determine what type of configurable behaviors to apply to register access requests from the embedded software debugger 142.

In step 310, the hybrid emulation is performed. A first DUT portion is emulated in the hardware emulation system 120. A second DUT portion is simulated in the simulation system 110. The simulation system 110 and the hardware emulation system 120 may communicate with each other during the hybrid emulation, through the exchange of transactions and pins.

In step 315, during the hybrid emulation, a subset of the emulated registers 176 are selectively mirrored in the hybrid register server 148. In specific, during the hybrid emulation, a simulation of the second portion of the DUT (e.g. model 146) can generate register access requests (read/write) for one or more emulated registers 176 of the second DUT portion emulated in the hardware emulation system 120. The hybrid register server 148 receives the simulation register access requests. The hybrid register server 148 sends the simulation register access requests to the hardware emulation system 120. The registers 176 in the hardware emulation system are accessed. If the access is a read, the value of the register is sent from the hardware emulation system 120 to the hybrid register server 148. The hybrid register server 148 stores the values of a subset of the registers 176 in the mirrored registers 152 so that it can mirror the subset of the registers 176. The specific subset of registers that is mirrored by the hybrid register server 148 is dynamically reconfigurable using different configuration files 144. The reconfiguration can be done without needing to re-load or alter the representation 172 of the first DUT portion into the hardware emulation system 120. Values for other emulated registers 176 that are not in the identified subset are not stored in the hybrid register server 148.

In step 320, the hybrid emulation is paused. For example, the pause can occur when a software breakpoint is reached. In another example, the pause can be initiated by the software programmer.

In step 325, while the hybrid emulation is paused, register access requests from the embedded software debugger are handled. In specific, the embedded software debugger 142 generates a register access request for a register from the emulated registers 176. The register access request is received at the hybrid register server 148. The emulated register that access is requested to may have been previously mirrored in the mirrored registers 152. Access requests to different registers 176 are handled with different configurable read mode and write mode behaviors, as previously described. Some read mode behaviors may result in the value stored in the mirrored registers 152 being returned to the embedded software debugger 142. Other behaviors may result in the register access request being sent to the hybrid register client 174. In this situation, the hybrid register client 174 accesses the requested emulated register responsive to receiving the register access request from the HRS 148. The hybrid register client 174 accesses the emulated register using a backdoor register access mechanism that does not have a side effect. The hybrid register client 174 sends the value of the register to the HRS 148. The value of the register may be stored in the hybrid register server 148 and also sent to the embedded software debugger 142. It is noted that in alternate embodiments debug accesses may come from a virtual prototype debugger as well as user debug access through a unified command line interface (UCLI) of a virtual prototype run-time.

In one or more embodiments of the present disclosure, the principles described herein can be applied to other storage elements other than registers. In one or more embodiments of the present disclosure, a non-transitory computer readable medium stores instructions that when executed by a processor cause the processor to implement the operations described herein.

What is claimed is:

1. A hybrid emulation system for hybrid emulation of a design under test (DUT), the system comprising:
   a hardware emulation system configured to:
      emulate a first portion of the DUT during the hybrid emulation, the hardware emulation system including emulated registers for the first portion of the DUT,
      access, during debug and responsive to receiving a request to access a first register of the emulated registers, the first register using a first access mechanism; and
      access, during the debug and responsive to receiving a request to access a second register of the emulated registers, the second register of the emulated registers using a second access mechanism;
   a simulation system configured to:
      simulate a second portion of the DUT during the hybrid emulation,
      selectively mirror, during the hybrid emulation, a subset of the emulated registers identified by the configuration file, the subset of the emulated registers including the first register and second register; and
   a configuration file that identifies:
      the subset of the emulated registers,
      the first access mechanism for use by the hardware emulation system to access the first register, and
      the second access mechanism for use by the hardware emulation system to access the second register.

2. The hybrid emulation system of claim 1, further comprising:
   an embedded software debugger in the simulation system;
   wherein the hardware emulation system supports a third access mechanism that causes a side effect to occur when the emulated registers are accessed during debug,
   wherein the first access mechanism and the second access mechanism do not cause the side effect to occur when the emulated registers are accessed during debug,
   wherein the hardware emulation system is configured, according to the configuration file, to use one of the first access mechanism or the second access mechanism in response to an access request from the embedded software debugger.

3. The hybrid emulation system of claim 2, wherein the side effect is a clear on read.

4. The hybrid emulation system of claim 1, further comprising:

an embedded software debugger in the simulation system; and a hybrid register server in the simulation system that supports configurable behaviors for handling requests received from the embedded software debugger for accessing the subset of the emulated registers, the configurable behaviors being configured based on information in the configuration file.

5. The hybrid emulation system of claim 4, wherein the configurable behavior comprises handling requests received from the embedded software debugger for accessing the subset of the emulated registers.

6. The hybrid emulation system of claim 1, wherein:
the second portion of the DUT comprises a processor; and
the simulation system further comprises an instruction accurate model of the processor that is used to simulate the second portion of the DUT.

7. The hybrid emulation system of claim 1, wherein the simulation system comprises:
a virtual prototype including a hybrid register server, the hybrid register server configured with the configuration file to selectively mirror, during the hybrid emulation, the subset of the plurality of the registers identified by the configuration file.

8. A method for hybrid emulation of a design under test (DUT), the method comprising:
emulating a first portion of the DUT by an emulation system during the hybrid emulation, the hardware emulation system including emulated registers for the first portion of the DUT;
accessing, by the emulation system during debug and responsive to receiving a request to access a first register of the emulated registers, the first register using a first access mechanism identified by a configuration file that is used to configure the emulation system; and
accessing, by the emulation system during the debug and responsive to receiving a request to access a second register of the emulated registers, the second register of the emulated registers using a second access mechanism identified by the configuration file;
simulating a second portion of the DUT by a simulation system during the hybrid emulation; and
selectively mirroring, by the simulation system, a subset of the emulated registers identified by a configuration file that is used to configure the simulation system.

9. The method of claim 8, wherein the hardware emulation system supports a third access mechanism that causes a side effect to occur when the emulated registers are accessed, wherein the first access mechanism and the second access mechanism for the emulated registers do not cause the side effect to occur when the emulated registers are accessed, and wherein the method further comprises:
using, by the hardware emulation system, one of the first access mechanism or the second access mechanism in response to an access request from the embedded software debugger.

10. The method of claim 9, wherein the side effect is a clear on read.

11. The method of claim 8, wherein the simulation system comprises an embedded software debugger and a hybrid register server, the method comprising:
receiving, by the hybrid register server from the software debugger, debug requests for accessing the subset of the emulated registers; and
handling the requests in accordance with configurable behaviors, the configurable behaviors being configured based on information in the configuration file.

12. The method of claim 11, wherein the configurable behavior comprises handling requests received from the embedded software debugger for accessing the subset of the emulated registers.

13. The method of claim 8, wherein the second portion of the DUT comprises a processor, the second portion of the DUT simulated using an instruction accurate model of the processor.

14. The method of claim 8, wherein the simulation system comprises a virtual prototype including a hybrid register server, the method comprising:
selectively mirroring, during the hybrid emulation with the hybrid register server, the subset of the plurality of the registers identified by the configuration file.

15. A non-transitory computer readable medium storing instructions, the instructions when executed by the processor cause the processor to implement operations for hybrid emulation of a design under test (DUT), the operations comprising:
emulating a first portion of the DUT by an emulation system during the hybrid emulation, the hardware emulation system including emulated registers for the first portion of the DUT;
accessing, by the emulation system during debug and responsive to receiving a request to access a first register of the emulated registers, the first register using a first access mechanism identified by a configuration file that is used to configure the emulation system; and
accessing, by the emulation system during the debug and responsive to receiving a request to access a second register of the emulated registers, the second register of the emulated registers using a second access mechanism identified by the configuration file;
simulating a second portion of the DUT by a simulation system during the hybrid emulation; and
selectively mirroring, by the simulation system, a subset of the emulated registers identified by a configuration file that is used to configure the simulation system.

16. The non-transitory computer readable medium of claim 15, wherein the simulation system comprises an embedded software debugger, wherein the hardware emulation system supports a third access mechanism that causes a side effect to occur when the emulated registers are accessed, wherein the first access mechanism and the second access mechanism for the emulated registers do not cause the side effect to occur when the emulated registers are accessed, and wherein the operations comprise:
using, by the hardware emulation system, one of the first access mechanism or the second access mechanism in response to an access request from the embedded software debugger.

17. The non-transitory computer readable medium of claim 15, wherein the side effect is a clear on read.

18. The non-transitory computer readable medium of claim 15, wherein the simulation system comprises an embedded software debugger and a hybrid register server, and the operations comprise:
receiving, by the hybrid register server from the software debugger, requests for accessing the subset of the emulated registers; and
handling the requests in accordance with configurable behaviors, the configurable behaviors being configured based on information in the configuration file.

19. The non-transitory computer readable medium of claim 15, wherein the second portion of the DUT contains to a processor, the second portion of the DUT simulated using an instruction or cycle accurate model of the processor.

20. The non-transitory computer readable medium of claim 15, wherein the simulation system comprises a virtual platform including a hybrid register server, the operations comprising:

selectively mirroring, during the hybrid emulation with the hybrid register server, the subset of the plurality of the registers identified by the configuration file.

21. The hybrid emulation system of claim 1, wherein the first access mechanism comprises accessing the emulated registers via a bus and wherein a second access mechanism comprises bypassing the bus to access the register of the emulated registers.

22. The hybrid emulation system of claim 1, wherein the simulation system is further configured to, responsive to receiving the request to access a third register of the emulated registers:

provide a value of a third mirrored register to fulfill the request to access the third register, the third mirrored register storing a value of the third register mirrored during hybrid emulation.

23. The hybrid emulation system of claim 1, wherein the simulation system is further configured to:

responsive to receiving the request to access the first register:

update a first mirrored register of the mirrored subset of the emulated registers using a value of the first register accessed using the first access mechanism, and provide an updated value of the first mirrored register to fulfill the request to access the first register; and responsive to receiving the request to access the second register:

maintain the value of a second mirrored register storing a value of the second register mirrored during hybrid emulation, and provide the value of the second register accessed using the first access mechanism to fulfill the request to access the second register.

* * * * *